United States Patent [19]

Baron

[11] 4,073,981
[45] Feb. 14, 1978

[54] METHOD OF SELECTIVELY DEPOSITING METAL ON A SURFACE

[75] Inventor: William James Baron, Franklin Township, Somerset County, N.J.

[73] Assignee: Western Electric Company, Inc., New York, N.Y.

[21] Appl. No.: 776,814

[22] Filed: Mar. 11, 1977

[51] Int. Cl.² .................. B05D 3/10; B05D 5/12
[52] U.S. Cl. ..................... 427/259; 427/98; 427/265; 427/266; 427/305; 427/306
[58] Field of Search ............. 427/304, 305, 306, 259, 427/98, 265, 266

[56] References Cited

U.S. PATENT DOCUMENTS

| Re. 23,514 | 6/1952 | Voss et al. | 260/45.5 |
|---|---|---|---|
| 2,286,062 | 6/1942 | Combo et al. | 260/32 |
| 2,320,724 | 6/1943 | Gerhart et al. | 260/23 |
| 2,543,601 | 2/1951 | Rowland | 260/78.5 |
| 2,703,756 | 3/1955 | Herrick, Jr. et al. | 95/7 |
| 2,719,141 | 9/1955 | Smith, Jr. | 260/77.5 |
| 2,746,837 | 5/1956 | Kirk | 8/94.33 |
| 2,816,091 | 12/1957 | Smith, Jr. et al. | 260/64 |
| 2,854,338 | 9/1958 | Herrick, Jr. et al. | 96/75 |
| 2,882,257 | 4/1959 | Hessel et al. | 260/45.4 |
| 2,971,842 | 2/1961 | Moore et al. | 96/33 |
| 3,011,920 | 12/1961 | Shipley, Jr. | 117/213 |
| 3,072,482 | 1/1963 | Beeber et al. | 96/75 |
| 3,532,518 | 10/1970 | D'Ottavio | 106/1 |
| 3,632,435 | 1/1972 | Eriksson et al. | 117/212 |
| 3,657,003 | 4/1972 | Kenney | 117/120 |
| 3,672,925 | 6/1972 | Feldstein | 427/305 X |

FOREIGN PATENT DOCUMENTS 864,033   2/1961   United Kingdom.

OTHER PUBLICATIONS

GAF Technical Bulletin No. 7543-017, "Gantrez® an poly[methyl vinyl ether/maleic anhydride]."

Primary Examiner—Ronald H. Smith
Assistant Examiner—Evan K. Lawrence
Attorney, Agent, or Firm—J. Rosenstock

[57] ABSTRACT

A method is disclosed for selectively depositing a metal on a surface of a substrate capable of retaining thereon a colloidal activating metal for electroless metal deposition. The method comprises coating a portion of the surface with a copolymer of maleic anhydride and a vinyl monomer, wherein the copolymer coat is selectively incapable of retaining thereon the colloidal activating metal species, to delineate an uncoated surface pattern which is capable of retaining the colloidal activating metal species thereon. The selectively coated surface is treated with a sol comprising the colloidal activating metal species to deposit the metal species only on the uncoated surface pattern. Subsequently, the colloidal species deposited pattern may be exposed to an electroless metal deposition solution to deposit a metal thereon.

17 Claims, 3 Drawing Figures

METHOD OF SELECTIVELY DEPOSITING METAL ON A SURFACE

BACKGROUND OF THE INVENTION

1. Field of the Invention

This invention relates to a method of depositing a metal on a surface and more particularly, to a method of selectively depositing a metal on a surface of an electrically non-conductive substrate.

2. Description of the Prior Art

There is a growing need in various devices and circuit applications for an inexpensive process which will produce inherent conducting circuit patterns on a non-conductor surface. Most of the processes used for metallic pattern generation involve a photographic step. Pattern resolution may be good but most methods are often slow, involving many process steps, and are relatively expensive.

A conventional method for producing macro circuit patterns employs a copper-clad insulator board coated with a photoresist material which is photoexposed and chemically processed to selectively remove copper, leaving a desired circuit pattern. This method is effective but wasteful of copper and chemicals. The high cost of this method has encouraged research and development toward new techniques for metallic pattern generation on a non-conductor surface.

An electroless metal deposition process is especially attractive for metallic pattern generation since one only needs to produce a pattern of a suitable catalyst on a substrate and metal deposition will occur only on that pattern. One selective electroless metal deposition process, described in U.S. Pat. No. 3,632,435, prepares a substrate surface whereby the surface has divergent surface characteristics with respect to the retention of (1) a colloidal stannous salt, or (2) a colloidal noble metal applied from a bath containing a stannous salt and a noble metal salt. The divergent surface characteristics are obtained by rendering a selected area smooth as compared to another area (rough) or vice-versa. The relatively rougher area will retain the colloidal material upon treatment with a reactive stripper or destabilizing media whereas the smoother surface will not. The stripper materials include solutions of strong electrolytes or organic compounds which react with the colloidal tin or noble metal species. The use of roughening and/or smoothing expedients as well as the use of reactive strippers involves several process steps which lengthens the process and makes it relatively expensive.

A method for selective metal deposition utilizing an electroless metal-deposition technique without the use of roughening and/or smoothing expedients and/or reactive stripping or destabilizing expedients is desired and needed. Research in this regard has led to inventions such as described in U.S. patent application Ser. No. 664,610, filed on Mar. 8, 1976 assigned to the assignee hereof which reveals selectively coating a portion of a surface with a colloidophobic material. The colloidophobic resulting coated portion repels or does not retain a colloidal species such as a colloidal tin species or a colloidal noble metal species, such as a palladium species. Also, U.S. patent application Ser. No. 678,327, filed on Apr. 19, 1976 assigned to the assignee hereof, reveals a selective metallization involving coating a portion of a surface with a polymer which is selectively capable of repelling or being incapable of retaining thereon a noble metal ion.

SUMMARY OF THE INVENTION

This invention relates to a method of depositing a metal on a surface and more particularly, to a method of selectively depositing a metal on a surface of an electrically non-conducting substrate capable of retaining thereon a colloidal activating metal species for electroless metal deposition.

The method comprises selectively coating a portion of the substrate surface with a copolymer of maleic anhydride and a vinyl monomer, wherein the copolymer coat is selectively incapable of retaining thereon the colloidal activating metal species, to delineate an uncoated surface pattern capable of retaining the colloidal activating metal species thereon. The selectively coated surface is treated with a sol comprising the colloidal activating metal species to deposit the colloidal species only on the uncoated surface pattern.

BRIEF DESCRIPTION OF THE DRAWINGS

The present invention will be more readily understood by reference to the following drawings taken in conjunction with the detailed description, wherein.

DETAILED DESCRIPTION

The present invention will be discussed primarily in terms of selectively depositing Pd and Cu on a surface of an electrically insulative substrate. It will be readily appreciated that the inventive concept is equally applicable to depositing other suitable metals, which are catalytically reduced from their respective ions by catalytic activating metals (Pt, Pd, Ag, Au, etc.).

Figure 1:
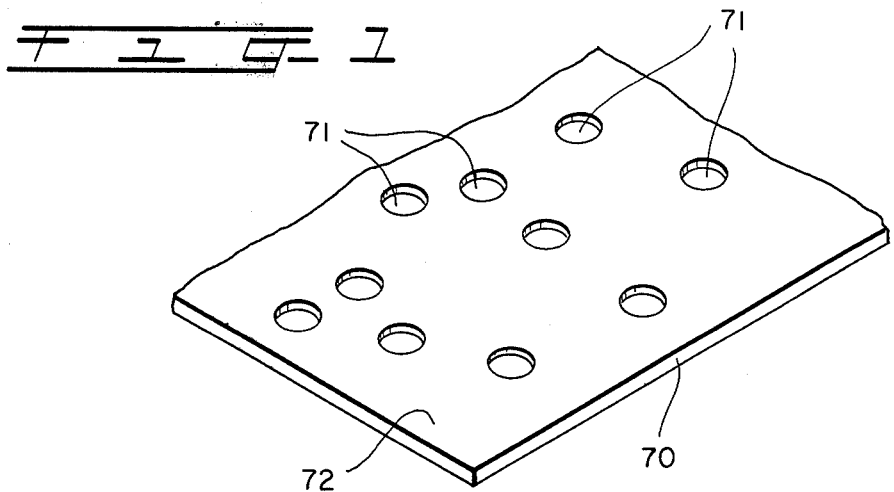
FIG. 1 is an isometric view of a portion of a typical substrate.

Referring to FIG. 1, a suitable substrate 70 is selected. For the production of electrical circuit patterns, suitable substrates are those which are generally electrically non-conductive. In general, all dielectric materials are suitable substrates. Dielectric materials commonly employed comprise a resinous material. If desired, the resinous material may incorporate fibrous reinforcement. For instance, paper or cardboard, glass fiber or other fibrous material may be impregnated with a phenolic, epoxy or fluorohydrocarbon (e.g., polytetrafluoroethylene) resinous material and pressed or rolled to a uniform thickness. Ceramic substrates may likewise be selected. Illustratively, substrate 70 is provided with a plurality of through-holes 71 which are drilled or punched in substrate 70 using any conventional technique known in the art.

Figure 2:
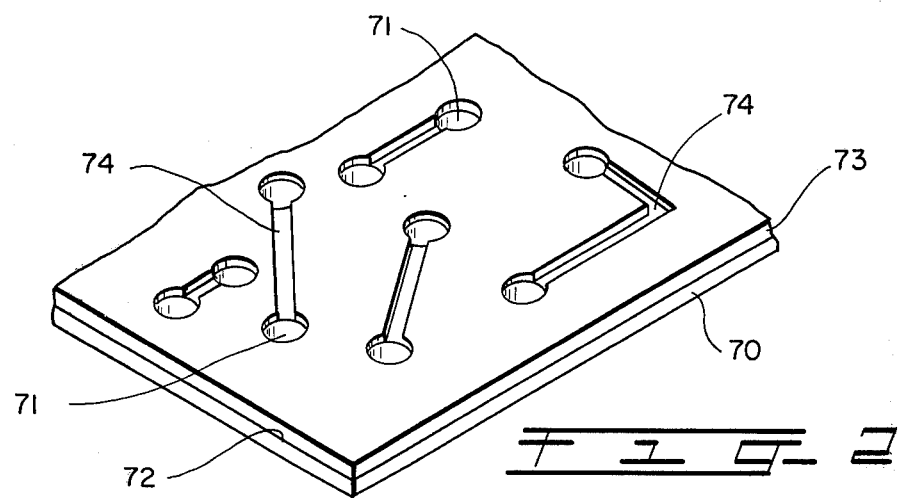
FIG. 2 is an isometric view of the portion of FIG. 1 which has been selectively coated with a copolymer of maleic anhydride with a vinyl compound.

Substrate 70 may then be cleaned or degreased employing techniques well known in the art. Referring to FIGS. 1 and 2, surface 72 of substrate 70 is treated with a suitable copolymer of maleic anhydride and a vinyl monomer to form a coat or layer 73 which delineates an exposed or uncoated surface pattern 74, including the walls of through-holes 71.

Suitable copolymers of maleic anhydride and vinyl monomer include copolymers obtained by reacting maleic anhydride with vinyl esters, vinyl ethers, or vinyl halides. Some suitable copolymers include styrene and maleic anhydride copolymers, vinyl acetate-maleic anhydride copolymers, isopropenyl acetate-maleic anhydride copolymers, alkyl acrylate or methacrylate copolymers wherein the alkyl group in each instance contains from 1 to 4 carbon atoms, such as methyl acrylate-maleic anhydride, methyl methacrylate-maleic anhydride, etc., copolymers, vinyl alkyl ether-maleic anhydride copolymers, such as vinyl methyl ether-maleic anhydride, vinyl butyl ether-maleic anhydride, etc., copolymers, ethylene-maleic anhydride copolymers and the like. Preferred copolymers are approximately 1:1 copolymers of maleic anhydride. One such preferred copolymer is a methyl vinyl ether-maleic anhydride copolymer.

Such maleic anhydride-vinyl copolymers are readily available commercially on the open market and are readily prepared by conventional methods well known to those skilled in the polymer and copolymer art, such as, for example, by heating, exposing to actinic light (e.g., ultraviolet light), or use of polymerization catalysts such as benzoyl peroxide, potassium persulfate, etc., or combinations of these polymerization accelerators, en mass, in solution or suspension in water or nonpolar solvents, with a mixture of maleic anhydride and the selected monomer. Specific reference, however, is made to U.S. Pat. Nos. Re 23,514; 2,320,724; and 2,286,062, all of which are incorporated hereinto by reference and which disclose some suitable copolymers, and typical conditions and processes for the formation thereof.

Typically, the copolymer is dissolved in a suitable solvent in a concentration of 1 to 25 weight percent solids, and is then selectively applied to surface 72 using any conventional means, e.g., brushing, stenciling, printing techniques, etc. Most of the copolymers are soluble in one or more common organic solvents such as acetone, dioxane, methyl ethyl ketone, pyridine, methyl cellosolve, ethyl cellosolve, cellosolve esters, chlorinated hydrocarbons, etc. Upon application of the copolymer, surface 72 is treated, e.g., heated, to evaporate or remove the solvent to form the dried layer 73 of copolymer. The resultant copolymer coat 73 is incapable of retaining thereon a colloidal activating metal species, e.g., colloidal palladium metal, upon exposure thereto. Exposed or uncoated surface pattern 74 retains its original capability of retaining (relative to surface 73) a colloidal activating metal species and upon exposure thereto will retain such colloidal species, e.g., colloidal palladium metal particles contained in a hydrosol. It is to be noted and stressed hereat that unlike other prior art techniques, the resultant copolymer-coated surface 73 and uncoated surface 74 do not have to have divergent physical characteristics such as relative roughness whereby the colloidal species will or will not be retained therein. Typically, the surfaces (73, 74) do not differ markedly in porosity and/or surface roughness.

The resultant substrate 70 is treated, e.g., by immersion or spraying, with a suitable sol containing a colloidal activating metal or noble metal species capable of participating in an electroless metal deposition, to deposit the colloidal activating metal species, e.g., colloidal palladium metal, on exposed surface 74 to form a film or coat thereon (not shown).

Particularly suitable and preferred colloidal sols comprising activating species capable of participating in an electroless metal deposition, by initially being capable of functioning as a reduction catalyst for the electroless metal deposition, exist as so-called "one-step activators." One such typical colloidal one-step activator, revealed in U.S. Pat. No. 3,011,920, incorporated hereinto by reference, contains stannous chloride, palladium chloride and aqueous hydrochloric acid. Colloidal palladium is formed by the reduction of the palladium ions by the stannous ions of the stannous chloride. Simultaneously, stannic oxide colloids are formed together with adsorbed stannic oxychloride and stannic chloride. The stannic acid colloids comprise protective colloids for the palladium colloids while the oxychloride constitutes a deflocculating agent further promoting the stability of the resulting colloidal solution. The relative amounts of the above ingredients can be varied provided the pH is below about 1 and provided excess stannous ions are maintained.

Another suitable colloidal one-step activator, revealed in U.S. Pat. No. 3,532,518, incorporated hereinto by reference, comprises acid palladium metal-stannous chloride sols.

Upon treatment or contact with the sol, the colloidal species contained therein, e.g., colloidal particles of palladium metal, are deposited on exposed surface 74 to form a film or coat thereof thereon (not shown). Substrate 70 is then treated, e.g., rinsed, with a suitable inert rinsing agent, e.g., water, whereby excess sol is removed from the surfaces of substrate 70 including copolymer-coated surface 73. It is to be pointed out, however, that exposed surface 74 retains the colloidal species thereon despite repeated and/or prolonged treatment, e.g., prolonged water rinsing. By an inert rinsing agent is meant any solution or agent which will remove excess sol from the surfaces of substrate 70 including surface 73 without chemically reacting with the sol including the colloidal species contained therein. Some typical suitable inert rinsing agents include liquid aliphatics; alcohols, e.g., methanol, ethanol, etc.; chlorinated hydrocarbons, e.g., chloroform, trichloroethylene, carbon tetrachloride, etc.; and ethers. A preferred rinsing agent comprises water.

Figure 3:
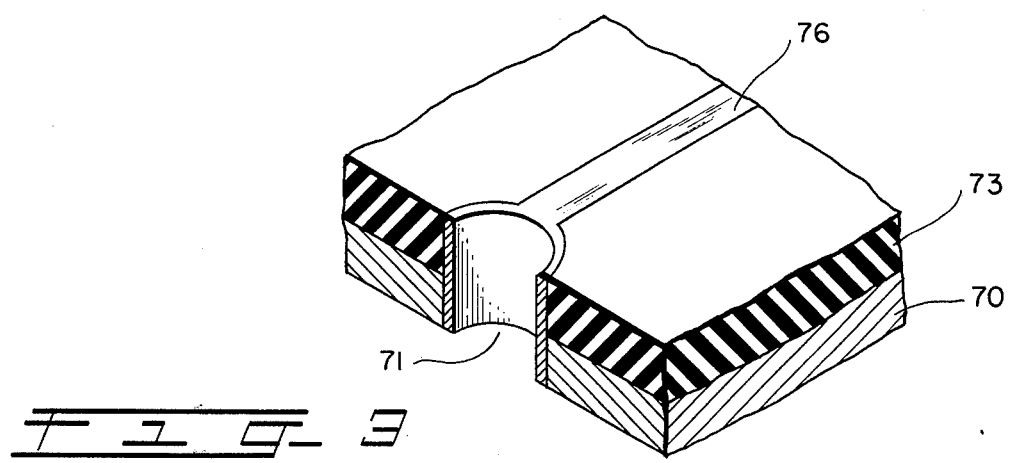
FIG. 3 is a partial isometric view of the substrate of FIG. 2 having a deposited metal pattern thereon.

When employing a one-step activator it is unnecessary to form or apply a further layer of a noble metal species on surface 74 since the activating metal species deposited is initially capable of participating in an electroless metal deposition catalysis. Accordingly, the thus one-step activator treated substrate 70 can be rinsed, as for example with water, and immediately immersed in a suitable electroless metal deposition solution, wherein an electroless metal ion, e.g., $Cu^{+2}$, $Ni^{+2}$, is reduced to the metal, e.g., $Cu^o$, $Ni^o$, and deposited on surface 74 of substrate 70 to form an electroless metal deposit 76 as shown in FIG. 3. Electroless metal pattern 76 may be built up to a desired thickness by continued electroless deposition or alternatively electroless metal-deposited pattern 76 may be electroplated using conventional electroplating techniques and plating baths.

It is to be noted that the various typical conventional electroless and electroplating solutions, plating conditions and procedures are well known in the art and will not be elaborated herein. Reference in this regard is made to *Metallic Coating of Plastics,* William Goldie, Electrochemical Publications, 1968.

After the electroless metal deposition or the electrodeposition is carried out, copolymer deposited pattern 73 may be removed, if desired, by treatment with a suitable solvent therefor, e.g., acetone, followed by mechanical scrubbing thereof, if needed.

It is to be pointed out and stressed hereat that the copolymer surface (pattern or coat 73) is selective with respect to the colloidal species with which it is contacted. Where the sol comprises only a colloidal species which is not a colloidal activating metal species, metallization of the surface can take place. For example, if a tin wetting sol of Kenney, U.S. Pat. No. 3,657,003 (incorporated hereinto by reference), is employed, such as (1) the pale yellow wetting sol of Example XXVI-F, (2) the pale yellow wetting sol of Example XXVI-G, and (3) the pale yellow wetting sol of Example XXVI-H, the colloidal tin species thereof will be deposited and retained on the surface of coat 73. Subsequent activation thereof with any conventional activating solution followed by exposure to an electroless metal deposition solution leads to electroless metallization of coat 73 as well as uncoated surface area 74. This selectivity is surprising and unexpected and the reason for it is as yet to be found.

In another manner, referring back to FIG. 1, the copolymer solution may be applied to the entire surface 72 of substrate 70 to form a continuous copolymer coat. The resultant continuous copolymer coat is then selectively printed or coated with a material, e.g., an ink, capable of accepting and retaining a colloidal species without deactivation thereof, in a pattern corresponding to the desired metal pattern (c.f. pattern 74 of FIG. 2). The printed surface is treated with the colloidal activating metal species containing sol and metallized in an electroless metal deposition solution whereby a metal deposit is only obtained on the inked surface areas. It is, of course, understood that any suitable, chemically compatible material which is capable of retaining a colloidal species may be employed.

EXAMPLE I

A portion of an epoxy-glass laminate was immersed at 25° C. for 1 minute in an acetone solution comprising one weight percent of a one-to-one molar ratio of methyl vinyl ether-maleic anhydride copolymer, commercially obtained from GAF Corporation and designated as "Gantrez An-139," having a specific viscosity of 25 centipoises (determined on a solution of 1 gm. of the copolymer in 100 ml. of methyl ethyl ketone at 25° C.). The laminate was then heated at 120° C. for 5 minutes. The resultant dried laminate was then immersed in a colloidal, tin-palladium catalyst solution (one-step sensitizer) comprising the solution resulting from the admixture of palladium chloride, hydrochloric acid and stannous chloride in water, the stannous chloride being in excess of the amount necessary to reduce the palladium and the solution having a pH less than about one. The catalyst solution is described in U.S. Pat. No. 3,011,920 and was commercially obtained from Shipley Company, Inc. of Newtown, Mass. under the designation "9F." The catalyzed laminate was water rinsed for 2 minutes at 25° C. and then immersed for 10 minutes at 25° C. in a commercially obtained electroless copper deposition solution. A 0.25 micrometer thick electroless copper deposit was obtained on all portions of the laminate except where it was coated with the copolymer solution.

EXAMPLE II

For comparison purposes, the procedure of Example I was repeated except that the laminate was heated at 150° C. for 2 minutes. The partially copolymer-coated laminate was immersed for 1 minute at 25° C. in a colloidal sensitizer solution comprising a hydrous oxide of tin. The sensitizer solution was prepared by dissolving in 100 ml. of deionized water 3.5 weight percent stannous chloride and one weight percent (with respect to the $H_2O$) of stannic chloride. The sensitized laminate was rinsed with deionized water for 2 minutes and then immersed for 1 minute in a 0.05 weight percent aqueous $PdCl_2$ bath to activate the laminate. The activated laminate was water rinsed for 2 minutes and immersed in the electroless metal deposition solution at 25° C. A 0.25 micrometer thick blanket copper deposit was obtained on the laminate including the copolymer-coated surfaces.

EXAMPLE III

For comparison purposes, the procedure of Example II was repeated except that the partially coated laminate was not sensitized but was immersed directly into 0.05 weight percent aqueous $PdCl_2$ solution for 2 minutes, after baking at 150° C. for 5 minutes and water rinsing. The laminate was then water rinsed for 2 minutes with deionized water and immersed in the electroless metal deposition solution. An electroless copper deposit was obtained only on the copolymer-coated surface and not on the exposed epoxy coated substrate surfaces (after 10 minutes).

EXAMPLE IV

The procedure of Example I was repeated except that the epoxy coated substrate was fully coated with the methyl vinyl ether-maleic anhydride copolymer. The resultant coated substrate was then heated at 120° C. for 5 minutes. An ink comprising (a) 58 weight percent of a commercially obtained diglycidyl ether of bisphenol A having an epoxide equivalent weight of 190 to 198, (b) 18 weight percent of a methylated urea formaldehyde resin, (c) 14 weight percent of phthalocyanine blue, (d) 9 weight percent of benzyl dodecyl dimethyl ammonium salt of montmorillonite clay and (e) one weight percent of a fluorinated flow control agent, was applied in a pattern to a portion of a copolymer-coated surface and cured at 400° F. for 20 minutes. The resultant cured ink patterned substrate was then immersed in the one-step sensitizer of Example I for 2 minutes at 25° C. The sensitized substrate was water rinsed for 2 minutes at 25° C. and then immersed in the electroless solution for 10 minutes. An electroless copper deposit was obtained only on the ink pattern.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of selectively depositing a metal on a surface of a substrate capable of retaining thereon a colloidal activating metal species for electroless metal deposition, which comprises:
    (a) selectively coating the substrate surface by coating a portion thereof with a copolymer coat of maleic anhydride and a vinyl monomer, said coat being selectively incapable of retaining thereon said colloidal activating metal species, to delineate an uncoated surface pattern capable of retaining the colloidal activating metal species thereon; and thereafter
    (b) treating said selectively coated surface with a sol comprising said colloidal activating metal species to deposit said colloidal activating metal species only on said uncoated surface pattern.

2. The method as defined in claim 1 wherein said monomer is a methyl vinyl ether.

3. The method as defined in claim 1 wherein said colloidal activating metal species comprises colloidal palladium metal.

4. The method as defined in claim 1 wherein said sol comprises a colloidal suspension of stannous chloride and a noble metal salt.

5. The method as defined in claim 1 wherein, immediately following step (b), said treated surface is rinsed with an inert rinsing agent to remove excess sol.

6. The method as defined in claim 1 which further comprises exposing said colloidal species deposited pattern to an electroless metal deposition solution to electrolessly deposit a metal thereon.

7. A method of selectively depositing a metal on a dielectric surface capable of retaining thereon a colloidal noble metal species, which comprises:
 (a) selectively coating the dielectric surface by coating a portion thereof with a copolymer coat of maleic anhydride and a vinyl monomer, wherein said coat is selectively incapable of retaining thereon a colloidal noble metal species that is an activator for electroless metal deposition, to delineate an uncoated dielectric surface pattern capable of retaining the colloidal noble metal species; and thereafter
 (b) treating said selectively coated surface with a sol comprising said colloidal noble metal species to deposit said colloidal noble metal only on said uncoated pattern; and
 (c) exposing said noble metal deposited patterned surface to an electroless metal deposition solution to deposit a metal thereon.

8. The method as defined in claim 7 wherein said monomer is a methyl vinyl ether.

9. The method as defined in claim 8 wherein, immediately following step (b), said treated surface is rinsed with an inert rinsing agent to remove excess sol.

10. The method as defined in claim 9 wherein said sol comprises a colloidal suspension of stannous chloride and palladium metal salt.

11. The method as defined in claim 9 wherein said noble metal species comprises palladium metal.

12. A method of selectively depositing a metal on a coated surface of a substrate, which comprises:
 (a) coating the substrate surface with a copolymer of maleic anhydride and a vinyl monomer to form a copolymer coat, said coat being selectively incapable of retaining thereon a colloidal noble metal species that is an activator for electroless metal deposition;
 (b) selectively coating the copolymer-coated surface with a material capable of retaining the colloidal noble metal species thereon, to form a surface pattern of said material; and thereafter
 (c) treating said patterned surface with a sol comprising a colloidal noble metal species to deposit said colloidal noble metal species only on said pattern.

13. The method as defined in claim 12 wherein said monomer is a methyl vinyl ether.

14. The method as defined in claim 12 wherein said colloidal noble metal species comprises colloidal palladium metal.

15. The method as defined in claim 12 wherein said sol comprises a colloidal suspension of stannous chloride and palladium metal.

16. The method as defined in claim 12 wherein, immediately following step (c), said treated surface is rinsed with an inert rinsing agent to remove excess sol.

17. The method as defined in claim 12 which further comprises treating said noble-metal deposited patterned surface with an electroless metal deposition solution to deposit a metal thereon.

* * * * *